United States Patent [19]

Eversteijn et al.

[11] 3,892,607

[45] July 1, 1975

[54] METHOD OF MANUFACTURING SEMICONDUCTOR DEVICES

[75] Inventors: Franciscus Cornelis Eversteijn; Hermanus Leonardus Peek, both of Emmasingel, Eindhoven, Netherlands

[73] Assignee: U.S. Philips Corporation, New York, N.Y.

[22] Filed: Dec. 15, 1972

[21] Appl. No.: 315,644

Related U.S. Application Data

[63] Continuation of Ser. No. 126,337, March 19, 1971, abandoned, which is a continuation of Ser. No. 718,564, April 3, 1968, abandoned.

[30] Foreign Application Priority Data

Apr. 28, 1967 Netherlands ....................... 6706005

[52] U.S. Cl. .................. 148/186; 148/1.5; 357/52; 427/85

[51] Int. Cl. ......................... C23c 11/00; H01l 7/00

[58] Field of Search ........... 117/201, 106 A, 106 R, 117/107.2, 200, 215; 148/186, 1.5; 317/235 AG; 357/52

[56] References Cited

UNITED STATES PATENTS

| | | | |
|---|---|---|---|
| 2,916,400 | 12/1959 | Homer | 117/107.2 |
| 2,972,555 | 2/1961 | Deutscher | 117/106 |
| 2,990,295 | 6/1961 | Breining | 117/106 |
| 3,089,793 | 5/1963 | Jordan | 117/106 |
| 3,200,019 | 8/1965 | Scott, Jr. | 117/106 |
| 3,306,768 | 2/1967 | Peterson | 117/106 |
| 3,310,425 | 3/1967 | Goldsmith | 117/201 |
| 3,390,024 | 6/1968 | Stein | 148/185 |
| 3,396,052 | 8/1968 | Rand | 317/235 |
| 3,432,405 | 3/1969 | Pilling | 317/235 |

*Primary Examiner*—Michael F. Esposito
*Attorney, Agent, or Firm*—Frank R. Trifari; Leon Nigohosian

[57] ABSTRACT

Method of producing a device including a semiconductor body, comprising the steps of reacting an oxysilane compound and a tri-alkyl aluminum compound to produce aluminum silicate and depositing the aluminum silicate as a layer on a surface of said body.

12 Claims, 4 Drawing Figures

3.892,607

INVENTORS
FRANCISCUS C.EVERSTEIJN
HERMANUS L.PEEK
BY
Frank R. Trifari
AGENT

METHOD OF MANUFACTURING SEMICONDUCTOR DEVICES

The present application is a continuation of application Ser. No. 126,337, filed Mar. 19, 1971, presently abandoned, which in turn is a continuation of application Ser. No. 718,564, filed Apr. 3, 1968, now abandoned, claiming priority under Dutch application No. 6706005, filed Apr. 28, 1967.

This invention relates to the manufacture of semiconductor devices in which a layer consisting of aluminium silicates is provided from a gas phase on semiconducting material, said gas phase containing organic aluminium and silicon compounds.

In this connection aluminium silicate is to be understood to mean a mixture of $Al_2O_3$ and $SiO_2$ to which a very slight quantity of an active impurity may possibly be added forming a vitreous or crystalline compound or agglomerate which need not be bound to a certain simple molecule ratio between $Al_2O_3$ and $SiO_2$.

Silicate glasses and generally oxide layers are used for various purposes in the technique or planar semiconductor devices, for example, as a masking material for local diffusion of active impurities from the gas phase, as a shield against atmospheric influences, as a source of diffusion of active impurities and as an insulting coating on the semiconductor surface.

There are various methods of providing these layers. Of these methods, the one in which the layer is provided from the gas phase has the advantage that a homogeneous structure and composition is obtained.

Thus it has been suggested to provide an $SiO_2$ layer by pyrolysis of tetra-ethoxysilane which is in the gas phase. The temperature which must be used in this case lies in the range of 600° – 800°C. The speed of forming said oxide layer is small at comparatively low temperatures. The disadvantage of the said high temperature is that undesired reactions may occur if the substrate is a heat-sensitive semiconducting material. Said reactions may occur inter alia if $A^{III}B^{V}$-compounds form the semiconducting material. If the $A^{III}B^{V}$-compound consists of gallium arsenide, the gallium arsenide may readily decompose while As is evaporated.

It is, however, known per se that layers consisting of $Al_2O_3$ and $SiO_2$ may be deposited at comparatively low temperatures, for example, 350°C. An organic aluminium compound such as triisobutyl aluminium and oxygen was used as a raw material for $Al_2O_3$ and an organic silicon compound such as tetra-ethoxysilane was used as a raw material for $SiO_2$. See an earlier paper published by one of us in Philips Research Reports, Vol. 21, pages 379–386 (1966), the contents of which should be considered incorporated herein.

Although this gives the possibility of providing an oxide layer on a surface at a comparatively low temperature the gas mixture appears to have the drawback that in spite of the low temperature it may have an oxidizing action of the semiconductor surface due to the oxygen which is used for oxidizing Al into $Al_2O_3$. Said oxidizing action is a drawback especially if the semiconducting material consists of an $A^{III}B^{V}$-compound, for example, GaAs.

An object of the invention is inter alia to provide a solution to this problem. It is based on recognition of the fact that an oxysilane, for example, the tetraethoxysilane the decomposition of which is enhanced by the presence of an organic aluminium compound could itself provide oxygen for the oxidation of the aluminium. In this connection it must be noted that if a silicon compound is chosen as a compound containing oxygen, this does not imply that an aluminium compound containing oxygen could not be used.

However the situation is such, that with the temperature unchanged, the saturated vapour tension of organic aluminium compounds is lower than that or organic silicon compounds, and that the saturated vapour tension of aluminium or silicon compounds containing oxygen is again lower than that of the corresponding compounds free of oxygen so that a comparable vapour pressure can be realized in a simple manner at a certain temperature with a silicon compound containing oxygen and an aluminium compound free of oxygen.

According to the invention a method of manufacturing semi-conductor devices in which a layer mainly consisting of aluminium silicate is provided from a gas phase on semiconducting material, said gas phase containing organic aluminium and silicon compounds, is characterized in that at least during a first period of the formation of the layer in the gas phase the total oxygen content of the free oxygen and of those oxygen-containing compounds which, except for oxygen, do not contain any component of the layer is smaller than is necessary for converting the aluminium in the gas phase into aluminium oxide. The invention also relates to a semi-conductor device manufactured in accordance with said method.

The method according to the invention is particularly suitable for use with semiconductor materials which consist of an $A^{III}B^{V}$-compound, especially gallium arsenide, in which an oxidizing action would detract from the semiconductor properties of the material.

The organic silicon compound preferably consists of an oxysilane and the organic aluminium compound of a trialkyl aluminium. It is readily possible to choose therefrom combinations of compounds of the two said types, the vapour tensions of which are sufficiently close to each other and also sufficiently high to be able to compose a gas phase of the desired concentrations at temperature which are not too extreme, for example, the ambient temperature. This is more particularly the case with tetraethoxysilane and triisobutyl aluminium.

Furthermore it has been found that for forming aluminium silicate layers having satisfactory electrical properties, for example, from an oxysilane and organic aluminium compounds it is possible to entirely omit oxygen as such or in compounds, except for the silicon compound.

The amount of oxygen available by the oxysilane must then of course be able and sufficient except for forming $SiO_2$, to oxidize the organic aluminium compound(s) into $Al_2O_3$ and an excess of the oxygen-containing compound is preferably chosen.

It is therefore preferred to have a gas phase in which the fraction by volume of the organic silicon compounds is larger than the fraction by volume of the organic aluminium compounds.

To enhance the obtainment of optimum properties of the silicate layer it is preferred to choose the fraction by volume of the organic silicon compounds in the gas not higher than 15 times the fraction by volume of the organic aluminium compounds.

For obtaining optimum properties the fraction by volume of the organic silicon compounds in the gas phase in practice is preferably taken 4 to 7 times higher than the fraction by volume of the organic aluminium compounds.

It has not been found necessary to limit the content of oxygen in the gas phase to prevent oxidation of the substrate during the entire formation of the layer. It is sufficient for the content of oxygen to remain limited until a sealing layer has been formed after which oxygen can be admitted in higher concentrations.

Furthermore it has also been found that the method according to the invention can very well be used for manufacturing an oxide layer which may be used as a source of diffusion of an active impurity for doping the semiconductor material. The advantage of such a type of diffusion source is the great homogeneity of the composition due to the simultaneous deposition of the components. An active impurity in volatile form may be added to the mixture of gases from which the aluminium and silicon oxides are deposited. This expression is to be understood to mean that the active impurity may be a constituent of a volatile compound or may be used as such if it has at least in itself already such a vapour tension that a mixture of gases can be composed therewith suitable for the manufacture of a source of diffusion.

Because of its satisfactory volatility at ambient temperature a volatile organic compound is preferably used as a volatile compound. It has been found that tin is particularly suitable for doping $A^{III}B^{V}$-compounds by diffusion from a silicate layer manufactured according to the invention. When using tin as an active impurity tetramethyl tin is preferably added because of its satisfactory volatility at ambient temperatures.

In order that the invention may be readily carried into effect, it will now be described in detail, by way of example, with reference to the accompanying diagrammatic drawing in which FIG. 1 is a view of a device for carrying out the method according to the invention.

Figure 1:
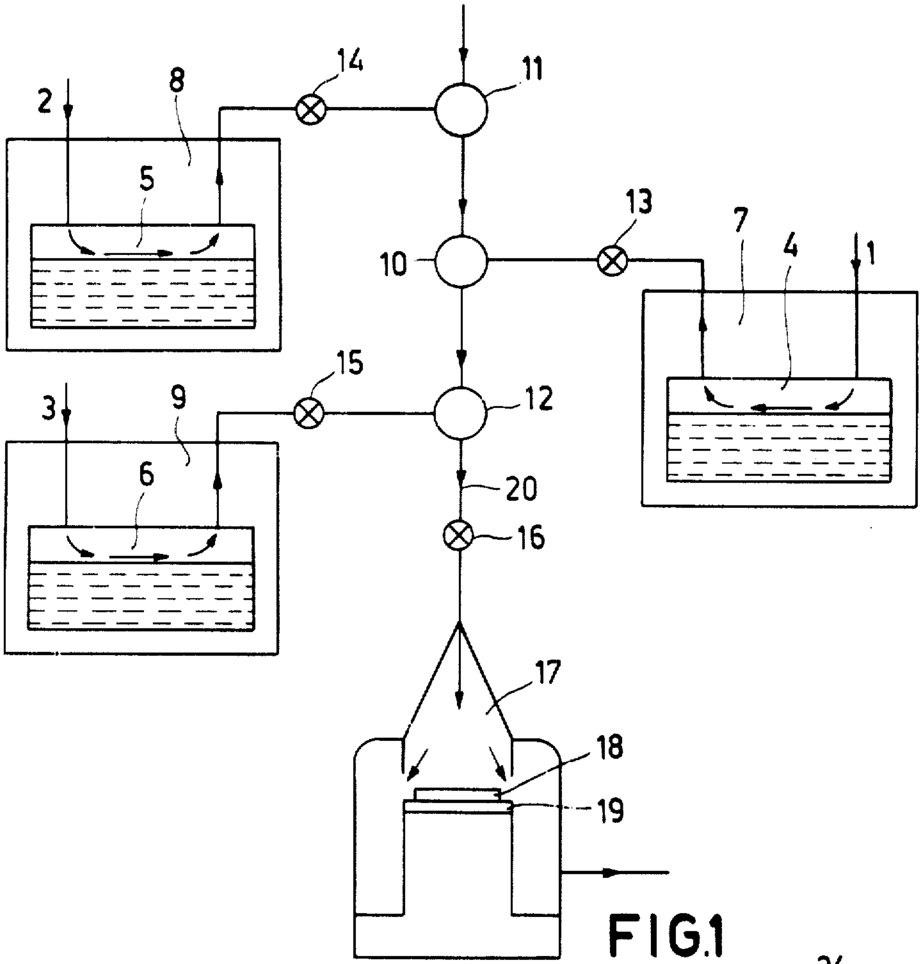
FIG. 1 shows the separate evaporation of the organic compounds of the components in a stream of inert carrier gas (for example, $N_2$ or Argon) after which the total gas stream is led along a heated substrate on which the silicate layer is deposited by heating.

The organic compound of silicon is tetra-ethoxysilane and the organic aluminium compound is triisobutyl aluminium. If in the embodiment the aluminium silicate layer to be formed is used for doping tin, which is a donor for gallium arsenide, this is added in the form of tetramethyl tin.

The arrows 1, 2 and 3 show the flow directions of the carrier gases with tetra-ethoxysilane, triisobutyl aluminium and tetramethyl tin, respectively, towards the spaces 4, 5 and 6, in which the compounds of the components are present, preferably in a liquid state. The gases flow along the surfaces of liquid and carry along the liquid vapour. The thermostats 7, 8 and 9 in which the spaces 4, 5, 6 are present ensure that the desired temperature is maintained. Thus a partial pressure of tetra-ethoxysilane of approximately 1.4 mm Hg arises, for example, at 20°C in a flow of 400 mls/min. of nitrogen gas under approximately atmospheric pressure and a partial pressure of triiosobutyl aluminium of approximately 0.19 mm Hs arises at 25°C in a flow of 900 mls/min. of Argon. A nitrogen stream of gas containing tin may also be obtained at 20°C. If the last stream of gas is 100 mls/min. the total stream of gas is 1400 mls/min.

The gas streams are mixed possibly with the aid of an inert gas to form the total stream in the mixing spaces 10, 11 and 12.

Both the separate gas streams and the total one can be controlled by means of the taps 13, 14, 15, and 16.

The substrate 18, in this case lying on a heated base 19, is present in the vessel 17. The mixture of gases entering through 20 comes upon the substrate and deposits a silicate layer thereon. It appears that, when a layer is deposited in an atmosphere which is free from oxygen, also low temperatures of the substrate may be used as in the case when oxygen is present (ace Philips Research Reports, Vol. 21, pages 379–386 (1966). Suitable low temperatures lie in the range between 300°C and 500°C, for example 400°C, during this growing process.

The following Figures further show the deposition of silicate layers with reference to an example of a semiconductor body, in which an aluminium silicate layer is provided for doping a semiconductor substrate and an aluminium silicate layer for protection against oxidation and evaporation of the substrate and the doping.

Figure 2:
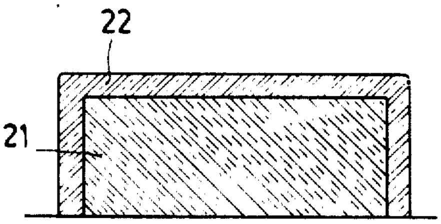
FIGS. 2, 3 and 4 are cross-sectional views of successive stages in the manufacture of a semiconductor device according to one embodiment of the method according to the invention in which gallium arsenide (GaAs) is used as semiconducting material.
Figure 3:
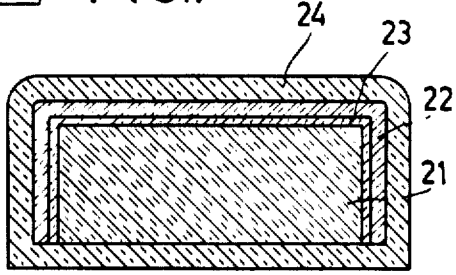

FIG. 2 shows a substrate consisting of p-type GaAs 21. An aluminium silicate layer 22 containing tin is provided thereon with the aid of a device as shown in FIG. 1.

Prior to diffusing from the silicate layer in the GaAs at 900°C a second layer of aluminium silicate is provided around the substrate in order to prevent the evaporation of tin and arsenic and also to keep the atmosphere free of oxygen during the diffusion.

This is effected by shutting off the supply of the tin compound by means of the tap 15 (see FIG. 1) and by subsequently depositing an aluminium silicate layer on the layer 22 during ½ hour. The thickness of the said layer then is 0.5 $\mu$m. The substrate is then inverted and the layer formation is continued. In this manner the substrate is covered with aluminium silicate 24 on all sides.

By diffusion at 900°C, tin converts a layer 23 of the GaAs into the n-type.

The substrate thus treated can now further serve for the manufacture of a semiconductor device. This applies more particularly to the manufacture of diodes.

Figure 4:
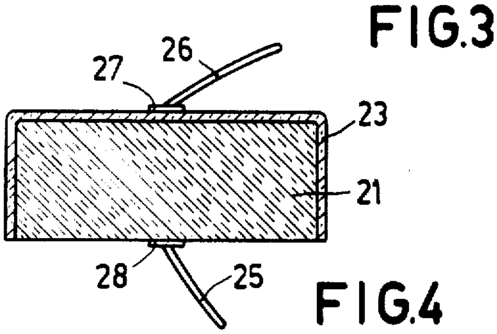

With the aid of conventional techniques the silicate layer may be removed fully or partially by carefully etching with an aqueous solution of $NH_4F$ and HF so that the GaAs exposed for providing contacts 27 and 28 by means of alloying or vapour deposition, to which contacts current supply wires 25 and 26, repsectively, may be secured (see FIG. 4).

In this embodiment tin was described as an active impurity. The invention may, however, also be used for other active impurities, for example, zinc as an acceptor for GaAs.

The invention is not limited to providing a doping layer or an insulating envelope; a different use of the method according to the invention, not described in this Application, relates to the manufacture of masking material or in general of layers for known purposes.

The invention is not confined to the organic compounds mentioned in the Example. The method may also be performed for instance with tri-n-butyl- and tripropylaluminium and with tetramethoxy-, diacthoxy- and triacthoxyalane. The invention is neither limited to providing a layer on GaAs but is generally applicable for the provision of aluminumsilicate layers on semiconductive substrates, especially those which are sensitive to oxygen.

What is claimed is:

1. A method of producing a device including a semiconductor body, said method comprising the steps of:

a. providing an oxysilane compound and a tri-alkyl aluminium compound, said oxysilane compound containing sufficient oxygen to oxidize the aluminum of said aluminum compound;

b. reacting in the gaseous phase said oxysilane compound and said tri-alkyl aluminum compound to produce aluminum silicate; and c. depositing said aluminum silicate as a layer on a surface of said body.

2. A method of producing a semiconductor device, comprising the steps of:

a. providing a semiconductor body;

b. providing a gas phase having active components consisting essentially of an oxysilane compound and a tri-alkyl aluminium compound;

c. reacting said oxysilane and said tri-alkyl aluminium compounds of said gas phase so that the aluminum of said compound is oxidized substantially by the oxygen of said oxysilane compound to provide aluminum silicate; and d. depositing said aluminum silicate as a layer on a surface of said body, said gas phase having a total oxygen content consisting of free oxygen contained in compounds that are present in said gas phase and that are substantially free of any major component of said aluminum silicate layer except oxygen, said total oxygen content being insufficient to oxidize said aluminum component during at least the initial period of the depositing step.

3. A method as recited in claim 2, wherein said semiconductor body consists essentially of an $A^{III}$ $B^{V}$ compound.

4. A method as recited in claim 3, wherein said $A^{III}$ $B^{V}$ compound is gallium arsenide.

5. A method as recited in claim 2, wherein said oxysilane compound is selected from the group consisting of tetra-ethoxysilane, tetramethoxysilane, diaethoxysilane and triacethoxysilane and said tri-alkyl aluminum compound is selected from the group consisting of triisobutyl aluminium, tri-n-butyl aluminium, and tripropylaluminum.

6. A method as recited in claim 2, wherein the volume fraction said oxysilane in said gas phase exceeds that of said trialkylaluminum compound.

7. A method as recited in claim 6, wherein the volume fraction of said oxysilane is not more than 15 times that of said trialkylaluminum compound.

8. A method as recited in claim 6, wherein the volume fraction of said oxysilane is 4 to 7 times larger than that of said trialkylaminium compound.

9. A method as recited in claim 2, wherein said gas phase further includes a volatile active impurity, said active impurity being deposited in said layer.

10. A method as recited in claim 9, wherein said volatile active impurity is tetramethyl tin.

11. A method recited in claim 9, further comprising the step of diffusing said active impurity from said layer into said semiconductor body.

12. A method as recited in claim 11, further comprising the step of depositing a second layer of aluminium silicate on said layer disposed on said body, said second layer being deposited before said diffusing step.

* * * * *